(12) United States Patent
Wang

(10) Patent No.: US 11,275,344 B2
(45) Date of Patent: Mar. 15, 2022

(54) TIME TO DIGITAL CONVERTER

(71) Applicant: AMLOGIC (SHANGHAI) CO., LTD., Shanghai (CN)

(72) Inventor: Yan Wang, Shanghai (CN)

(73) Assignee: AMLOGIC (SHANGHAI) CO., LTD., Shanghai (CN)

( * ) Notice: Subject to any disclaimer, the term of this patent is extended or adjusted under 35 U.S.C. 154(b) by 609 days.

(21) Appl. No.: 16/323,181

(22) PCT Filed: Sep. 27, 2018

(86) PCT No.: PCT/CN2018/108108
§ 371 (c)(1),
(2) Date: Feb. 4, 2019

(87) PCT Pub. No.: WO2019/210642
PCT Pub. Date: Nov. 7, 2019

(65) Prior Publication Data
US 2021/0349425 A1   Nov. 11, 2021

(30) Foreign Application Priority Data

May 2, 2018   (CN) .......................... 201810065618.4

(51) Int. Cl.
*H03M 1/12* (2006.01)
*G04F 10/00* (2006.01)
*H03K 3/037* (2006.01)

(52) U.S. Cl.
CPC ......... *G04F 10/005* (2013.01); *H03K 3/0372* (2013.01)

(58) Field of Classification Search
CPC .................................................. G04F 10/005

USPC ......................................... 341/155, 166, 140
See application file for complete search history.

(56) References Cited

U.S. PATENT DOCUMENTS

| 2011/0279299 | A1 | 11/2011 | Lee et al. |
| 2017/0214513 | A1* | 7/2017 | Asada .................. H04L 7/0337 |
| 2018/0091158 | A1* | 3/2018 | Sudo ........................ H03L 7/18 |

FOREIGN PATENT DOCUMENTS

| CN | 1274200 A | 11/2000 |
| CN | 102104384 A | 6/2011 |
| CN | 103676622 A | 3/2014 |
| CN | 103957005 A | 7/2014 |

* cited by examiner

*Primary Examiner* — Peguy Jean Pierre
(74) *Attorney, Agent, or Firm* — Levenfeld Pearlstein, LLC

(57) ABSTRACT

A time to digital converter includes a polarity detecting module and a time digital conversion module. The time digital conversion module includes a digital coding unit, a ring vibration enabling unit, multistage differential time delay units sequentially forming a closed loop in series and a plurality of trigger units. Each differential time delay unit includes a first input end, a second input end, a first output end and a second output end. The first output end and the second output end of each differential time delay unit outputs differential signals which are complementary to each other. Mismatching between the ascending and descending time of a phase inverter and sampling of a trigger can be improved to enable signals entering the trigger units to be phase-complementary signals, thus improving the linearity of digital conversion.

6 Claims, 2 Drawing Sheets

TIME TO DIGITAL CONVERTER

CROSS-REFERENCE TO RELATED APPLICATION DATA

This application is a US National Stage application of PCT/CN2018/108108, filed Sep. 27, 2018, which PCT application claims the benefit of and priority to Chinese Patent Application No. 201810065618.4, filed May 2, 2018, the disclosures of which are incorporated herein in their entireties.

BACKGROUND OF THE INVENTION

1. Field of the Invention

The present invention relates to the field of communication technology, particularly to a novel time to digital converter.

2. Description of the Related Art

Measurement technologies for time intervals, especially high-precision time intervals (picoseconds 1 ps=10E-12 s) are of significance, whether the field of engineering such as telecommunications, chip design and digital oscilloscopes, or the field of theoretical research such as atomic physics, astronomical observations, or the field of aerospace military technologies such as laser ranging, satellite positioning, needs high-precision time interval measurement technologies.

The traditional three-phase time to digital converter based on phase-locked loop is mainly used o generate clocks with different frequencies and even-distributed phases by using a phase-locked loop, to quantize the time interval. The time to digital converter is divided into high, medium and low segments, mainly for high precision and wide range.

Traditionally, a ring oscillator made by a simple inverter quantizes time interval through the ascending and descending delays of the inverter. The cycle of the ring oscillator can function as a large unit of measurement and can be recycled, so that a wide range is achieved when given a point area.

The traditional inverter functions as a single time interval quantization scale, and can achieve high resolution, but the range and area achieved are positively correlated, and the wide range means larger area and power consumption.

SUMMARY OF THE INVENTION

Aiming at the above mentioned problems, the present invention provides a novel time to digital converter, comprising:

a polarity detecting module, including two clock input ends for receiving clock signals, a first clock output end, a second clock output end and a state output end;

the polarity detecting module performs analysis of timing sequence on the clock signals input from the two clock input ends, and outputs one of the clock signals whose timing sequence is advanced from the first clock output end, outputs one of the clock signals whose timing sequence is delayed from the second clock out end, and outputs a signal of comparison result of timing sequence of two clock signals from the state output end;

a time to digital conversion module, including a digital coding unit, a ring vibration enabling unit, multistage differential time delay units sequentially forming a closed loop in series, and a plurality of trigger units;

the ring vibration enabling unit is connected to the closed loop and the first clock output end respectively to receive the one of the clock signals whose timing sequence is advanced and to control the turn-on and turn-off of the closed loop according thereto;

each differential time delay unit includes a first input end and a second input end, a first output end and a second output end, wherein the first output end and the second output end of each differential time delay unit output differential signals which are complementary to each other;

each of the plurality of the trigger units respectively includes two trigger input ends, two trigger output ends and a clock signal end; each of the plurality of the trigger units is correspondingly connected to the first output end and the second output end of one of the differential time delay units to output a pair of two trigger signals from two trigger output ends according to the differential signals which are complementary to each other; the clock signal end of each of the plurality of the trigger units is connected to the second clock output end to receive the one of the clock signals whose timing sequence is delayed;

the digital coding unit is connected to the state output end of the polarity detecting module and the two trigger output ends of each of the plurality of the trigger units to receive respectively the signal of comparison result of timing sequence and the pair of the trigger signals and generate encoded signals according thereto.

In the time to digital converter, the first output end or the second output end of the final stage of the multistage differential time delay units is further connected to a counter, the counter is used to calculate the oscillating period of the trigger signals output from the final stage of the trigger unit;

the counter is further connected to the digital coding unit to output a counting signal including the oscillation period to the digital coding unit;

the digital coding unit processes the counting signal to obtain a range parameter.

In the time to digital converter, each of the multistage differential time delay units further comprises a first delayer from the first input end toward the first output end, a second delayer from the second input end toward the second output end, a third delayer from the first output end toward the second output end, and a fourth delayer from the second output end toward the first output end.

In the time to digital converter, each of the plurality of the trigger units includes a sense amplifier structure.

In the time to digital converter, the signal of comparison result of timing sequence output from the state output end comprises a first state and a second state.

In the time to digital converter, the first state is a high level state and the second state is a low level state.

The beneficial effects of the novel time to digital converter proposed by the present invention is that the mismatch between the up-down time of the inverter and the sampling time of the trigger is significantly improved so that the signals entering the trigger unit are phase complementary signals, thereby the linearity of digital conversion can be improved.

BRIEF DESCRIPTIONS OF THE DRAWINGS

The accompanying drawings, together with the specification, illustrate exemplary embodiments of the present disclosure, and, together with the description, serve to explain the principles of the present invention.

DETAILED DESCRIPTION

Figure 1:
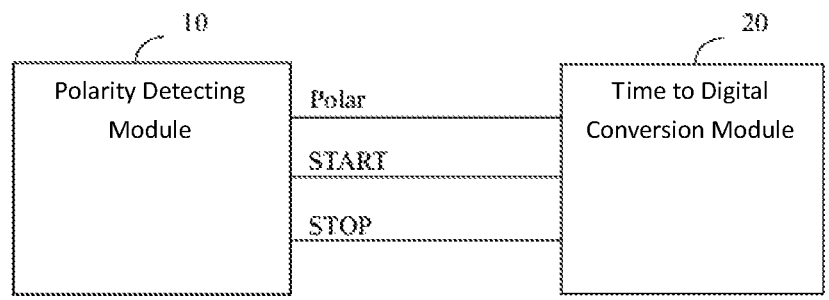
FIG. 1 is a schematic structural diagram of a time digital converter according to an embodiment of the present invention.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "plurality" means a number greater than one.

Hereinafter, certain exemplary embodiments according to the present disclosure will be described with reference to the accompanying drawings.

The present invention will now be further described with reference to the drawings and embodiments.

Figure 2:
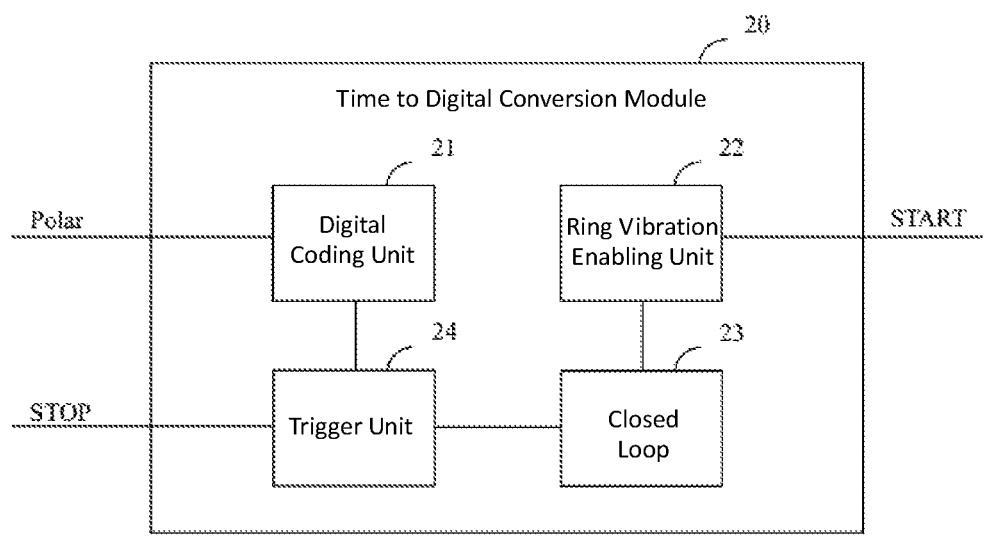
FIG. 2 is a schematic structural diagram of a time digital conversion module according to an embodiment of the present invention.
Figure 3:
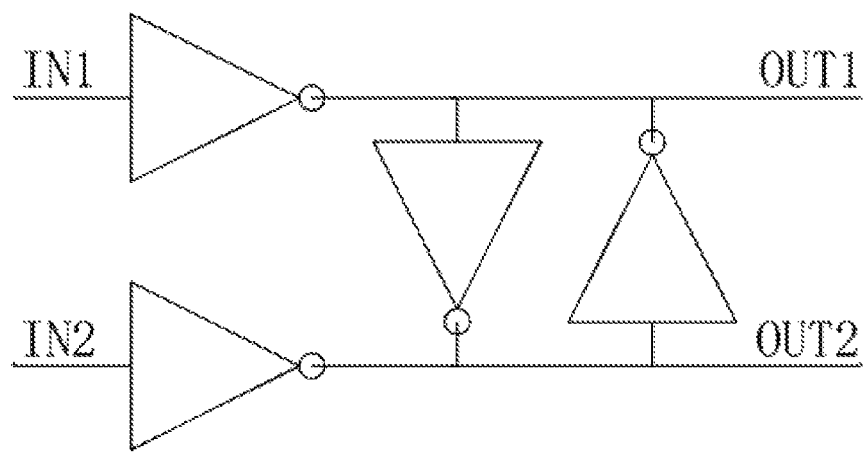
FIG. 3 is a schematic structural diagram of a differential time delay unit according to an embodiment of the present invention.
Figure 4:
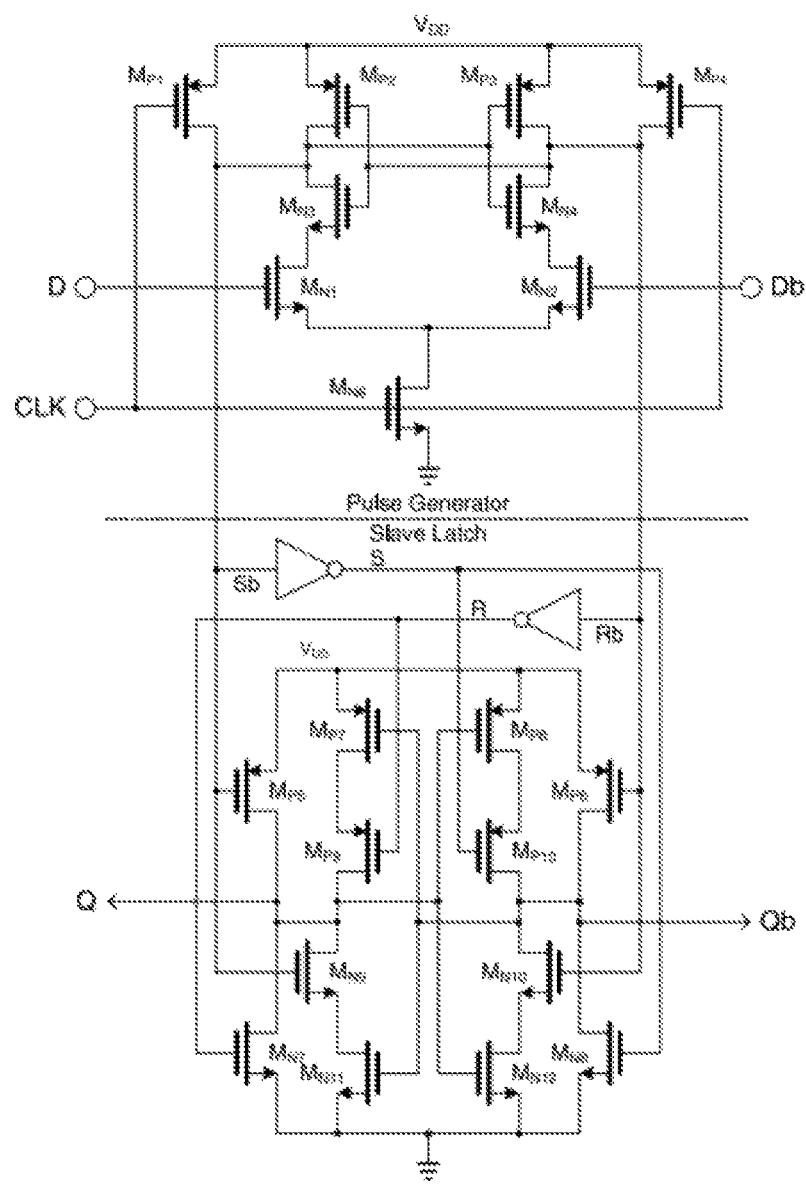
FIG. 4 is a schematic structural diagram of a trigger unit according to an embodiment of the present invention.

In a preferred embodiment, as shown in FIGS. 1 and 2, a novel time to digital converter is proposed, which may comprise:

a polarity detecting module 10, including two clock input ends (the first clock input end CLK1 and the second clock input end CLK2 in this embodiment) for receiving clock signals, a first clock output end START, a second clock output end STOP and a state output end Polar;

the polarity detecting module 10 performs analysis of timing sequence on the clock signals input from the two clock input ends, and outputs one of the clock signals whose timing sequence is advanced from the first clock output end START, outputs one of the clock signals whose timing sequence is delayed from the second clock out end STOP, and outputs a signal of comparison result of timing sequence of two clock signals from the state output end Polar;

a time to digital conversion module 20, including a digital coding unit 21, a ring vibration enabling unit 22, multistage differential time delay units sequentially forming a closed loop 23 in series, and a plurality of trigger units 24 (only a single one is shown in FIG. 2 to show the relationship of connection);

the ring vibration enabling unit 22 is connected to the closed loop 23 and the first clock output end START respectively to receive one of the clock signals whose timing sequence is advanced and to control the turn-on and turn-off of the closed loop 23 according thereto;

as shown in FIG. 3, each differential time delay unit includes a first input end IN1 and a second input end IN2, a first output end OUT1 and a second output end OUT2, wherein the differential signals output through the first output end OUT1 and the second output end OUT2 of each differential time delay unit 230 are complementary;

as shown in FIG. 4, each of the plurality of the trigger units 24 respectively includes two trigger input ends (the first trigger input end D and the second trigger input end Db in this embodiment), two trigger output ends (the first trigger output end Q and the second trigger output end Qb in this embodiment) and a clock signal end CLK; the two trigger input ends of each of the plurality of the trigger units 24 is correspondingly connected to the first output end OUT1 and the second output end OUT2 of one of the differential time delay units to output a pair of two trigger signals from two trigger output ends according to the differential signals which are complementary to each other; the clock signal end CLK of each of the plurality of the trigger units 24 is connected to the second clock output end STOP to receive the one of the clock signals whose timing sequence is delayed;

the digital coding unit 21 is connected to the state output end Polar of the polarity detecting module 10 and the two trigger output ends of each of the plurality of trigger units 24 to receive respectively the signal of comparison result of timing sequence and the pair of the trigger signals and then generate encoded signals according thereto.

In the above technical solution, the connection relationship of each of the trigger units 24 is specifically that the first trigger input end D is connected to the first output end OUT1 of the corresponding differential time delay unit, the second trigger input end Db is connected to the second output end OUT2 of the corresponding differential time delay unit. Since the signals output in each of the multistage differential time delay units 23 are signals with almost no delay which are complementary to each other, the linearity of the digital conversion is higher. The generated coding signals can be output to an external system or circuit or device for processing or displaying.

In a preferred embodiment, the first output end OUT1 or the second output end OUT2 of the final stage of the multistage differential time delay units is further connected to a counter, the counter is used to calculate the oscillating period of the trigger signals output from the trigger unit 24 of the final stage;

the counter is further connected to the digital coding unit 21 to output a counting signal including the oscillation period to the digital coding unit 21;

the digital coding unit 21 processes the counting signal to obtain a range parameter.

In a preferred embodiment as shown in FIG. 3, each of the multistage differential time delay units 23 further comprises a first delayer from the first input end IN1 toward the first output end OUT1, a second delayer from the second input end IN2 toward the second output end OUT2, a third delayer from the first output end OUT1 toward the second output end OUT2, and a fourth delayer from the second output end OUT2 toward the first output end OUT1.

In the above technical solutions, the delay values of the first delayer, the second delayer, the third delayer and the fourth delayer may be the same, but this is only a preferred case and it may also be another case.

In a preferred embodiment as shown in FIG. 4, each of the plurality of the trigger units may include a sense amplifier structure to increase the linearity of the trigger signals output from the first trigger output end Q and the second trigger output end Qb.

In a preferred embodiment, the signal of comparison result of timing sequence output from the state output end Polar comprises a first state and a second state.

Preferably, in the above embodiment, the first state is a high level state and the second state is a low level state.

In the above technical solution, correspondingly, the clock signal input from the first clock input end CLK1 may be delayed in comparison with the clock signal input from the second clock input end CLK2 when the signal of comparison result is in the high level state; on the contrary, the clock signal input from the second clock input end CLK2 may be delayed in comparison with the clock signal input from the first clock input end CLK1 when the signal of comparison result is in low level state. This is only a preferred case however and it should not be considered as a limitation of the present invention.

In summary, the present invention provides a novel time to digital converter comprising: a polarity detecting module and a time digital conversion module, wherein the time digital conversion module includes a digital coding unit, a ring vibration enabling unit, multistage differential time delay units sequentially forming a closed loop in series and a plurality of trigger units, wherein each differential time delay unit includes a first input end, a second input end, a first output end and a second output end, wherein the first output end and the second output end of each differential time delay unit output differential signals which are complementary to each other. Mismatching between the ascending and descending time of a phase inverter and sampling of a trigger can be improved obviously to enable signals entering the trigger units to be phase-complementary signals, thus the linearity of digital conversion can be improved.

Exemplary embodiments of the specific structure of the specific embodiments in reference to the description and drawings are given by way of illustration and can be transferred into others. While the present invention proposals a prior preferred embodiments, these are not intended to limit the present invention.

Various changes and modifications will no doubt become apparent to those skilled in the art. Accordingly, the appended claims are intended to cover all such modifications and changes within the spirit and range of the present invention. Any and all equivalents within the scope of the claims are intended to belong to the scope and spirit of the present invention.

The foregoing is only the preferred embodiments of the invention, not thus limiting embodiments and scope of the invention, those skilled in the art should be able to realize that the schemes obtained from the content of specification and figures of the invention are within the scope of the invention.

What is claimed is:

1. A time to digital converter, comprising:

a polarity detecting module including two clock input ends for receiving clock signals, a first clock output end, a second clock output end and a state output end;

the polarity detecting module performs analysis of timing sequence on the clock signals input from the two clock input ends, and outputs one of the clock signals whose timing sequence is advanced from the first clock output end, outputs one of the clock signals whose timing sequence is delayed from the second clock output end, and outputs a signal of comparison result of timing sequence of two clock signals from the state output end;

a time to digital conversion module including a digital coding unit, a ring vibration enabling unit, multistage differential time delay units sequentially forming a closed loop in series, and a plurality of trigger units;

the ring vibration enabling unit is connected to the closed loop and the first clock output end respectively to receive the one of the clock signals whose timing sequence is advanced and to control a turn-on and a turn-off of the closed loop according thereto;

each differential time delay unit includes a first input end and a second input end, a first output end and a second output end, wherein the first output end and the second output end of each differential time delay unit output differential signals which are complementary to each other;

each of the plurality of the trigger units respectively includes two trigger input ends, two trigger output ends and a clock signal end, each of the plurality of the trigger units is correspondingly connected to the first output end and the second output end of one of the differential time delay units to output a pair of two trigger signals from two trigger output ends according to the differential signals which are complementary to each other, the clock signal end of each of the plurality of the trigger units is connected to the second clock output end to receive the one of the clock signals whose timing sequence is delayed; and the digital coding unit is connected to the state output end of the polarity detecting module and the two trigger output ends of each of the plurality of the trigger units to receive respectively a signal of comparison result of timing sequence and the pair of the trigger signals and generate encoded signals according thereto.

2. The time to digital converter of claim 1, wherein the first output end or the second output end of a final stage of the multistage differential time delay units is further connected to a counter, the counter is used to calculate the oscillating period of the trigger signals output from the final stage of the trigger unit;

the counter is further connected to the digital coding unit to output a counting signal including the oscillation period to the digital coding unit; and the digital coding unit processes the counting signal to obtain a range parameter.

3. The time to digital converter of claim 1, wherein each of the multistage differential time delay units further comprises a first delayer from the first input end toward the first output end, a second delayer from the second input end toward the second output end, a third delayer from the first output end toward the second output end, and a fourth delayer from the second output end toward the first output end.

4. The time to digital converter of claim 1, wherein each of the plurality of the trigger units includes a sense amplifier structure.

5. The time to digital converter of claim 1, wherein the signal of comparison result of timing sequence output from the state output end comprises a first state and a second state.

6. The time to digital converter of claim 5, wherein the first state is a high level state and the second state is a low level state.

* * * * *